United States Patent
Luo et al.

(10) Patent No.: US 7,633,140 B2
(45) Date of Patent: Dec. 15, 2009

(54) INVERTED J-LEAD FOR POWER DEVICES

(75) Inventors: Leeshawn Luo, Santa Clara, CA (US); Anup Bhalla, Santa Clara, CA (US); Sik K. Lui, Sunnyvale, CA (US); Yueh-Se Ho, Sunnyvale, CA (US); Mike F. Chang, Cupertino, CA (US); Xiao Tiang Zhang, San Jose, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 611 days.

(21) Appl. No.: 10/732,181

(22) Filed: Dec. 9, 2003

(65) Prior Publication Data

US 2005/0127532 A1    Jun. 16, 2005

(51) Int. Cl.
*H01L 23/495* (2006.01)
(52) U.S. Cl. ...................... 257/666; 257/787
(58) Field of Classification Search ................ 257/787, 257/666, 676, 675, 696, 692, 693, 723, 724, 257/773
See application file for complete search history.

(56) References Cited

U.S. PATENT DOCUMENTS

| | | | | |
|---|---|---|---|---|
| 5,428,248 A | * | 6/1995 | Cha | 257/676 |
| 5,801,439 A | * | 9/1998 | Fujisawa et al. | 257/686 |
| 5,834,837 A | * | 11/1998 | Song | 257/692 |
| 5,835,988 A | * | 11/1998 | Ishii | 257/684 |
| 5,977,630 A | * | 11/1999 | Woodworth et al. | 257/712 |
| 5,986,209 A | * | 11/1999 | Tandy | 174/52.4 |
| 6,111,312 A | * | 8/2000 | Hirumuta et al. | 257/696 |
| 6,137,165 A | * | 10/2000 | Thierry | 257/690 |
| 6,188,021 B1 | * | 2/2001 | Tandy | 174/52.4 |
| 6,242,798 B1 | * | 6/2001 | Cha et al. | 257/673 |
| 6,331,738 B1 | * | 12/2001 | Kimura | 257/787 |
| 6,433,418 B1 | * | 8/2002 | Fujisawa et al. | 257/696 |
| 6,483,181 B2 | * | 11/2002 | Chang et al. | 257/686 |
| 6,744,133 B2 | * | 6/2004 | Tanabe et al. | 257/707 |
| 6,798,044 B2 | * | 9/2004 | Joshi | 257/666 |
| 6,977,431 B1 | * | 12/2005 | Oh et al. | 257/696 |

* cited by examiner

*Primary Examiner*—S. V Clark
(74) *Attorney, Agent, or Firm*—Schein & Cai LLP; James (Jingming) Cai

(57) ABSTRACT

A semiconductor package includes a lead frame having a plurality of leads and a lead frame pad, the lead frame pad including a die coupled thereto, at least one of the plurality of leads having an external portion sloped upwards relative to a bottom surface of the package, metal connectors connecting the die to the plurality of leads, and a resin body encapsulating the die, metal connectors and at least a portion of the lead frame.

26 Claims, 19 Drawing Sheets

US 7,633,140 B2

INVERTED J-LEAD FOR POWER DEVICES

BACKGROUND OF THE INVENTION

The present invention generally relates to semiconductor devices, more particularly to packaging of semiconductor devices, and more particularly to an inverted J-lead package for power devices.

Power semiconductor packages have evolved from through hole to surface mounted packages with the evolution of printed circuit board technology. Surface mounted packages generally include a lead frame on which a semiconductor device is mounted. The semiconductor device and a portion of the lead frame are generally encapsulated with a resin material. In a leaded package, lead terminals extend outside the resin body and include bonding pads for providing a wire bond connection from the semiconductor device to the lead terminal.

Major considerations in the packaging of semiconductor devices include high thermal dissipation, low parasitic inductance, low electrical resistance between the semiconductor device and the circuit environment, good reliability in terms of thermal cycling and thermal shock/fatigue, and minimal consumption of circuit board space.

By way of illustration and with reference to FIG. 1, a conventional semiconductor package generally designated 1 includes a lead frame generally designated 7 having a lead frame pad 10 to which is coupled a die 8. A portion of the lead frame 7 may be molded in a resin body 2. In this embodiment, the die 8 embodies a MOSFET device and the lead frame 7 includes a source terminal 18, a gate terminal 26, and a drain terminal 11. Source terminal 18 of the lead frame 7 includes a plurality of separate source lead frame leads 18a external to the resin body 2 and a plurality of separate internal source bonding areas 16 where bonding wires 6 are bonded. Drain terminal 11 includes a plurality of separate drain lead frame leads 11a which are connected to the lead frame pad 10. The gate terminal 26 is connected to an internal gate bonding area 20 which in turn is connected to a gate pad 17 by means of wire 28.

FIG. 2 illustrates a top view of another conventional semiconductor package generally designated 4 including a lead frame generally designated 9. In this embodiment, in lieu of a plurality of separate source bonding areas 16 as shown in FIG. 1, the source bonding areas 16 are joined to form a single source bonding area 30 for bonding wires 6 to die 8. As with the embodiment of FIG. 1, the separate source lead frame leads 18a and the separate lead frame drain leads 11a are separate narrow metal strips that radiate externally from the resin body 2 and are adapted to be inserted into the same receptacle location on a printed circuit board as the device shown in FIG. 1.

Similar to the embodiment of FIG. 1, the lead frame 9 has die 8 disposed thereon and provides a generally narrow border frame around the perimeter of die 8. Moreover, the bonding area 20 of gate terminal 26 is coupled via wire 28 to gate pad 17 formed at a nearest corner. In the prior art embodiments, the source and gate bonding areas 16, 30 and 27 respectively share the same left side of the die 8. Likewise, the source leads 18a and the gate lead 26 radiate from the same left side.

Referring now to FIG. 3, a top view of a conventional dual-die semiconductor package generally designated 7 having a lead frame generally designated 13 is shown. The dual-die semiconductor package 7 includes a pair of dies 50a and 50b mounted on a lead frame pad 52 and molded in a resin body 2. A first source terminal 18a includes a first source terminal bonding area 16a distributed along a left side of the first die 50a. The first source terminal bonding area 16a is connected to the first die 50a via bonding wires 6a. A first gate terminal 26a includes a first gate bonding area 20a that shares the left side of the first die 50a and is connected to the first die 50a via bonding wire 28a. A plurality of first drain terminals 11a are coupled to lead frame pad 52.

A second source terminal 18b includes a second source terminal bonding area 16b distributed along a left side of the second die 50b. The second source terminal bonding area 16b is connected to the second die 50b via bonding wires 6b. A second gate terminal 26b includes a second gate bonding area 20b that shares the left side of the second die 50b and is connected to the second die 50b via bonding wire 28b. A plurality of second drain terminals 11b are coupled to lead frame pad 52.

With reference to FIG. 4, a cross sectional view of a conventional semiconductor package such as semiconductor package 1 is shown. Die 8 is shown having a top surface 22 to which bonding wire 6 is coupled. Die 8 may be coupled to lead frame pad 10 by means of conventional material 12. Leads 18 and 11 are shown formed in a conventional "J" configuration. This configuration suffers the disadvantage of requiring that a portion of a printed circuit footprint be utilized for the leads 18 and 11.

A prior art leaded package is disclosed in U.S. Pat. No. 6,291,262 entitled "Surface Mount TO-220 Package and Process for the Manufacture Thereof". The disclosed package includes leads which are bent within the molded housing and formed prior to molding the housing around the lead frame. The bend is located inside the package body to minimize mechanical stresses on the package body. Although the portion of the lead extending outside the package is reduced, the leads still consume valuable footprint real estate.

Another prior art leaded package is disclosed in U.S. Pat. No. 6,211,462 entitled "Low Inductance Power Package for Integrated Circuits". The package includes a flat lead frame with internal leads formed upward to be in very close proximity to the lead frame pad. The external leads are flat and extend beyond the package edge so that good solder connections to a printed circuit board can be made and inspected.

A prior art solution to the use of leaded packages includes leadless packages. One such leadless package is disclosed in U.S. Pat. No. 4,682,207 entitled "Semiconductor Device Including Leadless Packages and a Base Plate for Mounting the Leadless Packages". Each leadless package includes a semiconductor chip housed therein and a plurality of electrodes formed on the four side surfaces and lower surface thereof. Leadless packages suffer the disadvantage of making the inspection of solder joints difficult.

As can be seen, there remains a need in the art for a semiconductor package that minimizes the consumption of circuit board space. Such a semiconductor package also preferably allows for easy inspection of solder joints while providing increased die size, reduced package height, and improved thermal resistance properties. Finally such a semiconductor package preferably provides for reduced on-resistance and inductance.

SUMMARY OF THE INVENTION

In accordance with one aspect of the invention, a semiconductor package includes a lead frame having a plurality of leads and a lead frame pad, the lead frame pad including a die coupled thereto, at least one of the plurality of leads forming an acute angle relative to a surface of the package, metal connectors connecting the die to the plurality of leads, and a resin body encapsulating the die, metal connectors and at least a portion of the lead frame.

In accordance with another aspect of the invention, a semiconductor package includes a lead frame having a plurality of leads and a pair of lead frame pads, each lead frame pad including a die coupled thereto, at least one of the plurality of leads having an external portion sloped upwards relative to a bottom surface of the package, metal connectors connecting each die to the plurality of leads, and a resin body encapsulating the die, metal connectors and at least a portion of the lead frame.

In accordance with yet another aspect of the invention, a semiconductor package housing an electronic device includes a lead frame having a plurality of leads and a lead frame pad, the lead frame pad including the electronic device coupled thereto, the plurality of leads having an external portion sloped upwards relative to a bottom surface of the package, metal connectors connecting the electronic device to the plurality of leads, and a resin body encapsulating the electronic device, metal connectors and at least a portion of the lead frame.

These and other features, aspects and advantages of the present invention will become better understood with reference to the following drawings, description and claims.

DETAILED DESCRIPTION OF THE INVENTION

The following detailed description is of the best modes of carrying out the invention. The description is not to be taken in a limiting sense, but is made merely for the purpose of illustrating the general principles of the invention, since the scope of the invention is best defined by the appended claims.

The present invention generally provides a semiconductor package that minimizes the consumption of circuit board space. External leads of the semiconductor package in accordance with the present invention are configured in an inverted "J" lead configuration. The semiconductor package also allows for easy inspection of solder joints while providing increased die size, reduced package height, and improved thermal resistance properties. The semiconductor package also provides for reduced on-resistance and inductance.

Figure 1:
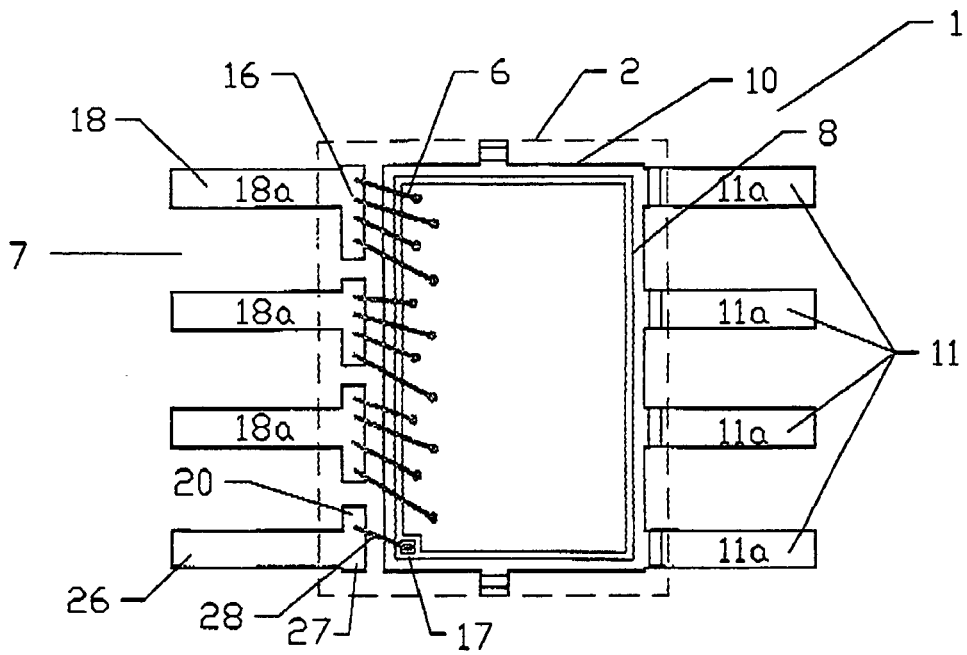
FIG. 1 is top view of a prior art semiconductor package.
Figure 2:
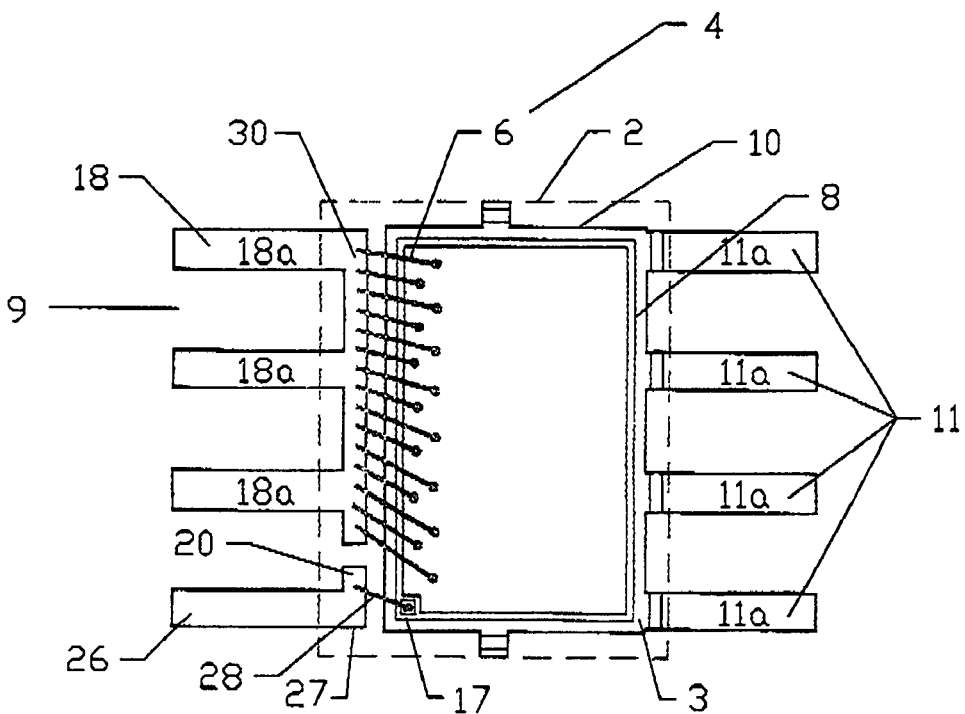
FIG. 2 is top view of another prior art semiconductor package.
Figure 3:
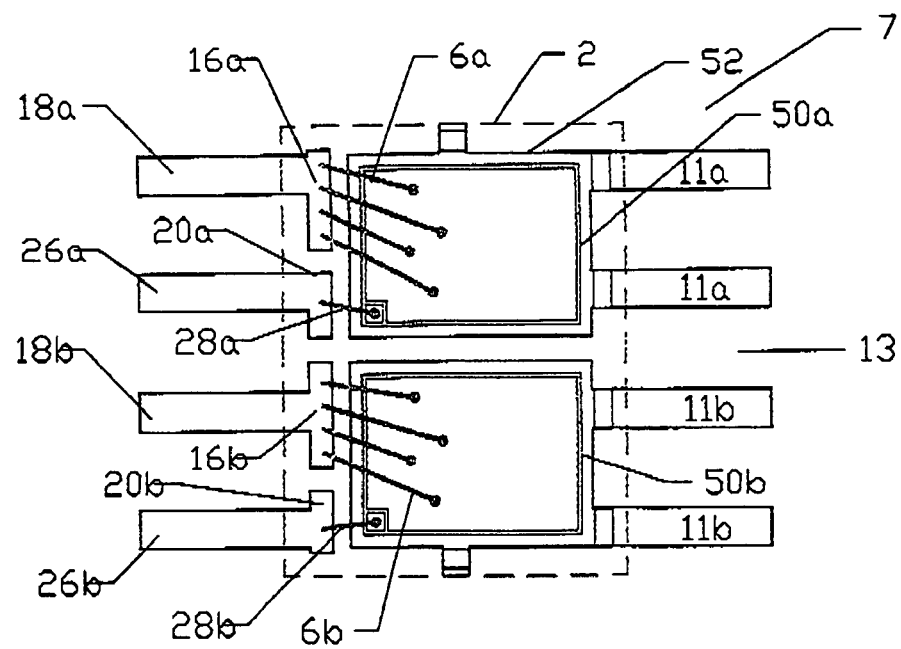
FIG. 3 is a top view of a prior art dual-die semiconductor package.
Figure 4:
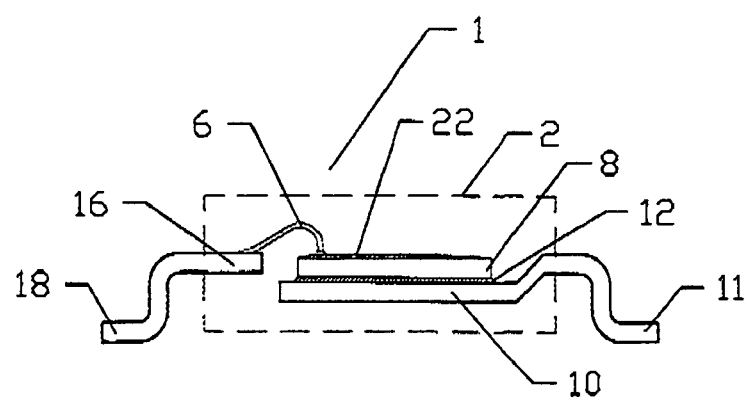
FIG. 4 is a cross sectional view of a conventional semiconductor package.
Figure 5A:
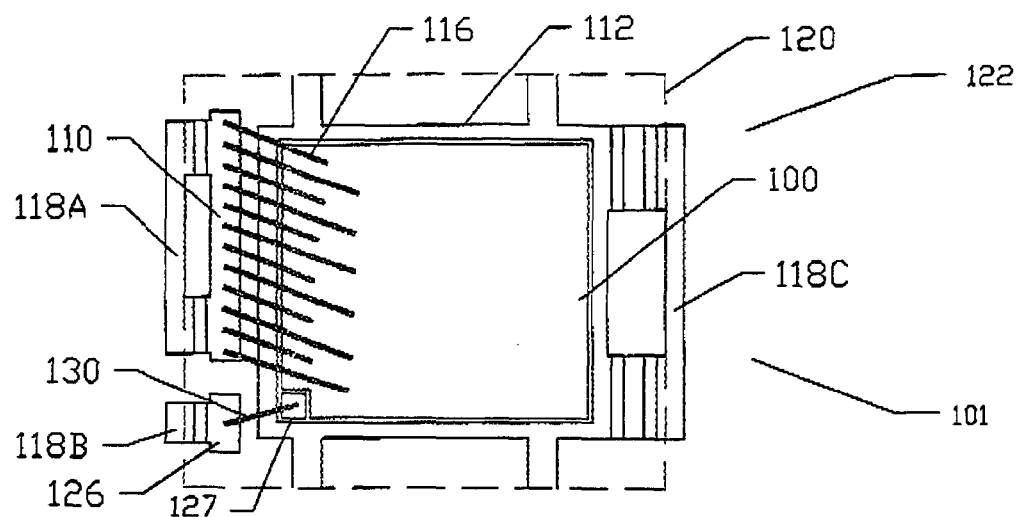
FIG. 5A is a top view of a semiconductor package in accordance with the present invention.

With reference to FIG. 5A, a semiconductor package generally designated 101 may include a lead frame generally designated 122 having a lead frame pad 112 to which may be coupled a die 100. A portion of the lead frame 122 may be molded in a resin body 120. The lead frame 112 may include a source lead 118A, a gate lead 118B, and a drain lead 118C. Source lead 118A may be disposed externally of resin body 120 and coupled to an internal source bonding area 110 which in turn may be coupled to a device source (not shown) by means of metal connectors 116. Metal connectors 116 may include bonding wires, straps, and tape as is well known in the art. Drain lead 118C may be connected to the lead frame pad 112. Gate lead 118B may be connected to an internal gate bonding area 126 which in turn may be connected to a gate pad 127 by means of metal connector 130.

Figure 5B:
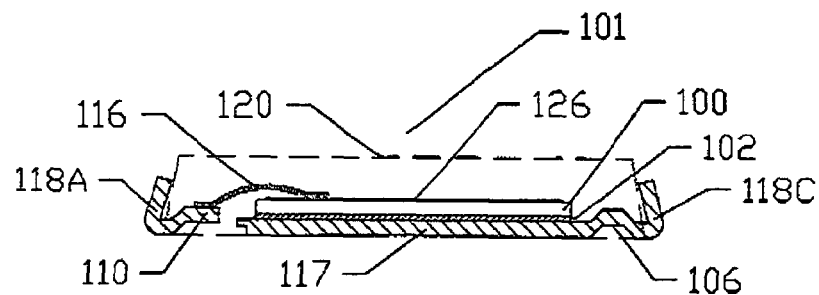
FIG. 5B is a cross sectional view of the semiconductor package of FIG. 5A in accordance with the present invention.
Figure 5C:
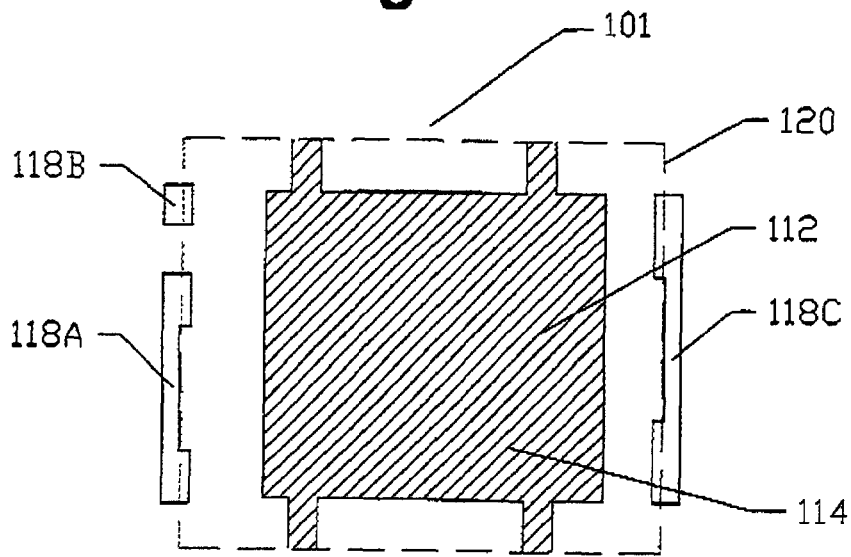
FIG. 5C is a bottom view of the semiconductor package of FIG. 5A in accordance with the present invention.

Source lead 118A, gate lead 118B, and drain lead 118C may be bent upwards in an inverted "J" configuration as shown in FIG. 5B and FIG. 5C. Source lead 118A, gate lead 118B, and drain lead 118C are shown sloped upward relative to a bottom surface 117 of semiconductor package 101 forming an acute angle relative thereto and exiting the resin body 120 such that bottom portions 119A, 119B, and 119C of source lead 118A, gate lead 119B, and drain lead 119C respectively are disposed substantially in a plane of bottom surface 117. Advantageously solder will wick up source lead 118A, gate lead 118B, and drain lead 118C to thereby provide for easy inspection of the solder joints and to increase the contact area for the source lead 118A, gate lead 118B, and drain lead 118C.

With particular reference to FIG. 5B, a notch 106 may be formed in drain lead 118C to allow the resin to grip the lead frame 112. Notch 106 may serve to reduce stress upon lead frame pad 112 during bending of drain lead 118C after encapsulation.

As will be clear to one skilled in the art, the configuration of semiconductor package 101 may provide for an increased die size by decreasing the portion of the printed circuit footprint consumed by source lead 118A, gate lead 118B, and drain lead 118C. Furthermore, and with particular reference to FIG. 5C, a bottom portion 114 of lead frame pad 112 may be exposed in semiconductor package 101 thereby providing improved thermal resistance properties to the semiconductor package 101.

Semiconductor package 101 additionally provides for reduced on-resistance and inductance by reducing the height of bonding areas 110 and 126 and therefore the lengths of metal connectors 116 and 130 respectively. The reduction of the height of bonding areas 110 and 126 also reduces the overall height of semiconductor package 101. Furthermore, and with reference to FIG. 5A, source lead 118A may be fused into one piece for facilitate the use of a maximum number of metal connectors 116 to thereby reduce on-resistance and inductance.

Figure 6A:
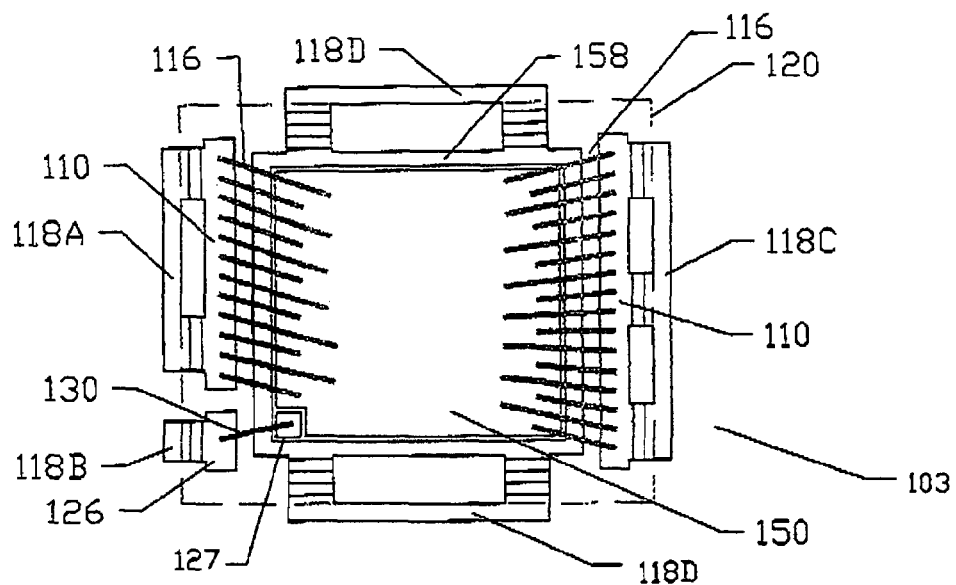
FIG. 6A is a top view of an alternative embodiment of a semiconductor package in accordance with the present invention.
Figure 6B:
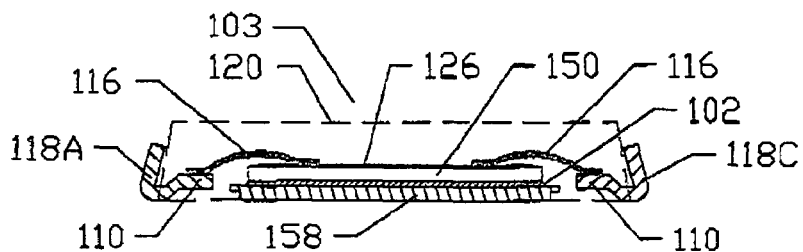
FIG. 6B is a cross sectional view of the semiconductor package of FIG. 6A in accordance with the present invention.
Figure 6C:
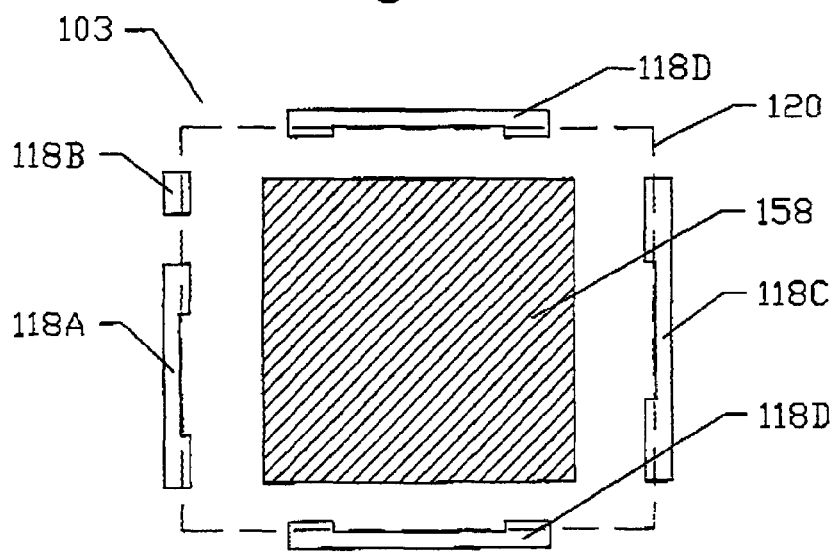
FIG. 6C is a bottom view of the semiconductor package of FIG. 6A in accordance with the present invention.

With reference to FIG. 6A, FIG. 6B, and FIG. 6C, a second alternative embodiment of the present invention generally designated 103 is shown. A die 150 may be bonded to a lead frame pad 158. Source lead 118A and gate lead 118B may be disposed as in the embodiment shown in FIG. 5A, FIG. 5B, and FIG. 5C with the addition of an additional source lead 118C. Drain leads 118D may be connected at opposite ends of lead frame pad 112. This embodiment advantageously provides for additional source metal connectors 116 for reduced on-resistance and source inductance.

Figure 7A:
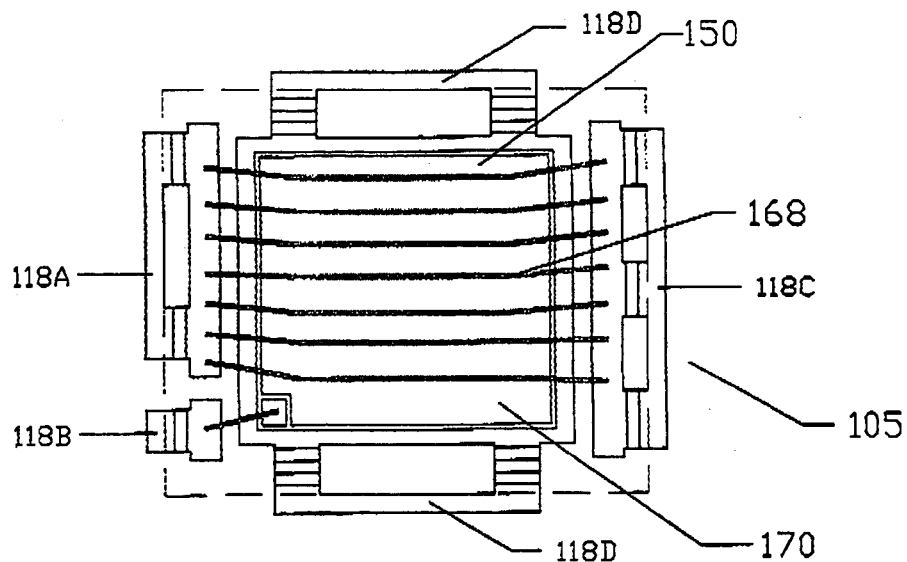
FIG. 7A is a top view of an alternative embodiment of a semiconductor package in accordance with the present invention.
Figure 7B:
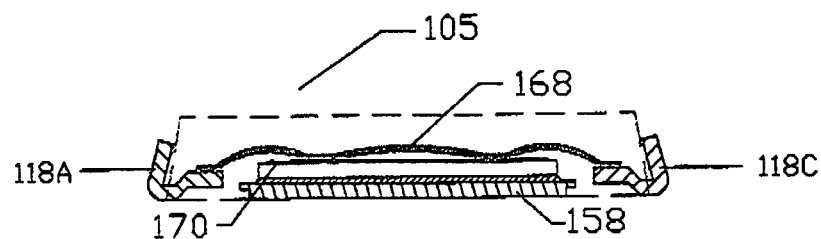
FIG. 7B is a cross sectional view of the semiconductor package of FIG. 7A in accordance with the present invention.
Figure 7C:
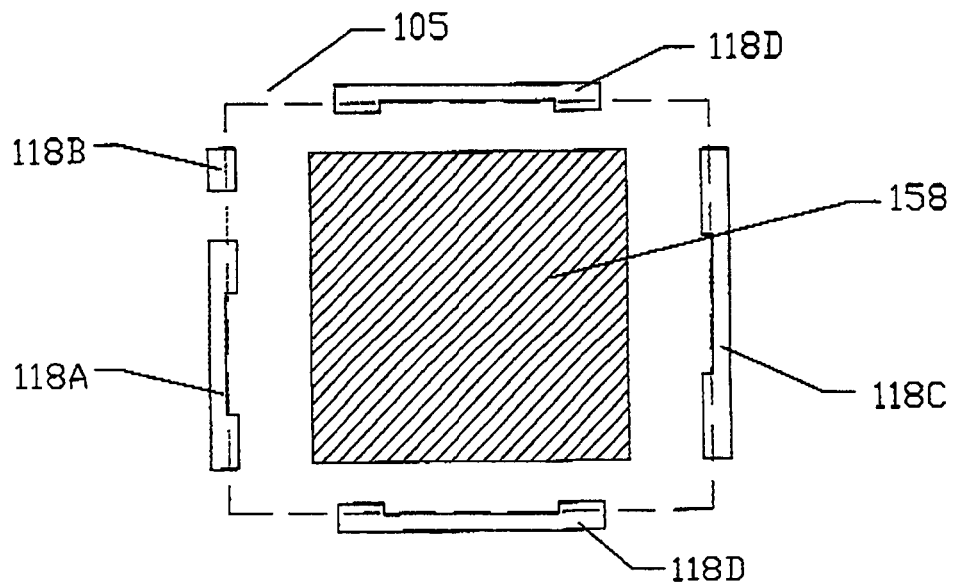
FIG. 7C is a bottom view of the semiconductor package of FIG. 7A in accordance with the present invention.

A third alternative embodiment of the present invention generally designated 105 is shown in FIG. 7A, FIG. 7B, and FIG. 7C. In contrast to the second alternative embodiment 103, the source leads 118A and 118C may be stitch bonded across the die 150 by means of metal connectors 168. This embodiment advantageously provides for reduced on-resistance by reducing metal spreading resistance at a die surface 170.

Figure 8A:
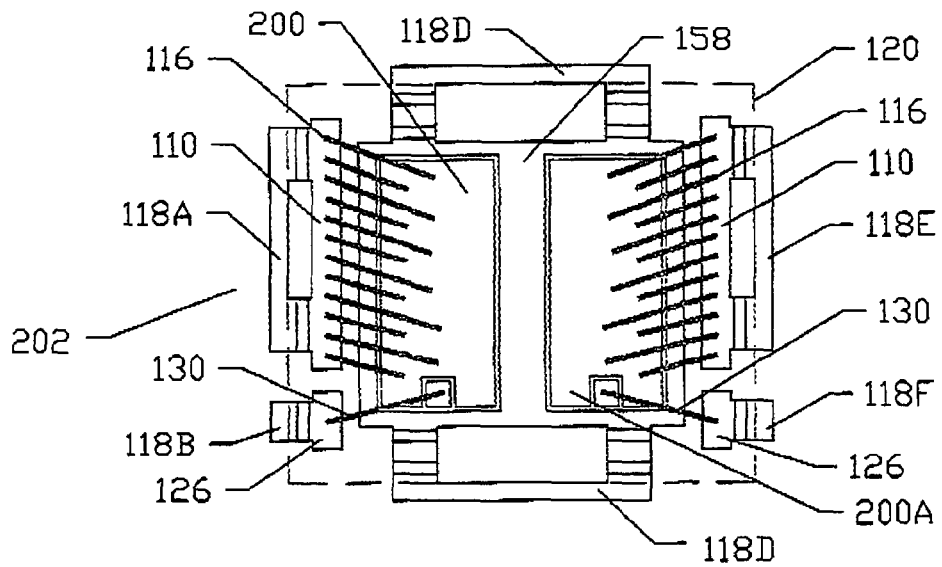
FIG. 8A is a top view of an alternative embodiment of a semiconductor package in accordance with the present invention.
Figure 8B:
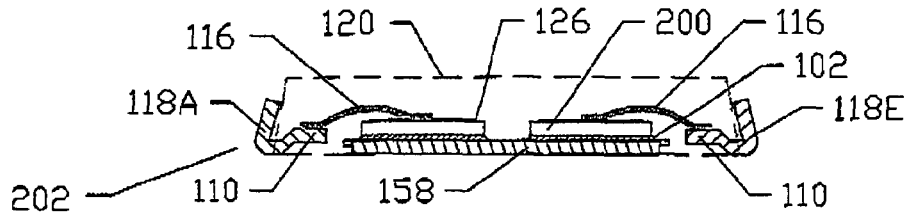
FIG. 8B is a cross sectional view of the semiconductor package of FIG. 8A in accordance with the present invention.
Figure 8C:
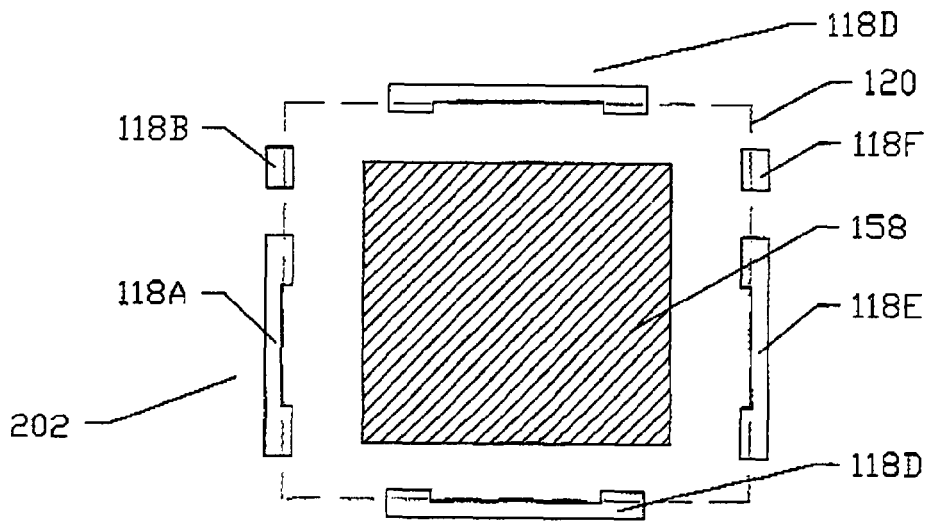
FIG. 8C is a bottom view of the semiconductor package of FIG. 8A in accordance with the present invention.

With reference to FIG. 8A, FIG. 8B, and FIG. 8C a fourth alternative embodiment of the present invention generally designated 202 is shown. Semiconductor package 202 may be implemented as a common drain dual die device. A pair of devices 200 and 200A may be bonded to lead frame pad 158. Device 200 may include a source lead 118A, a gate lead 118B, and shared drain leads 118D. Device 200A may include a source lead 118E, a gate lead 118F, and the shared drain leads 118D.

Figure 9A:
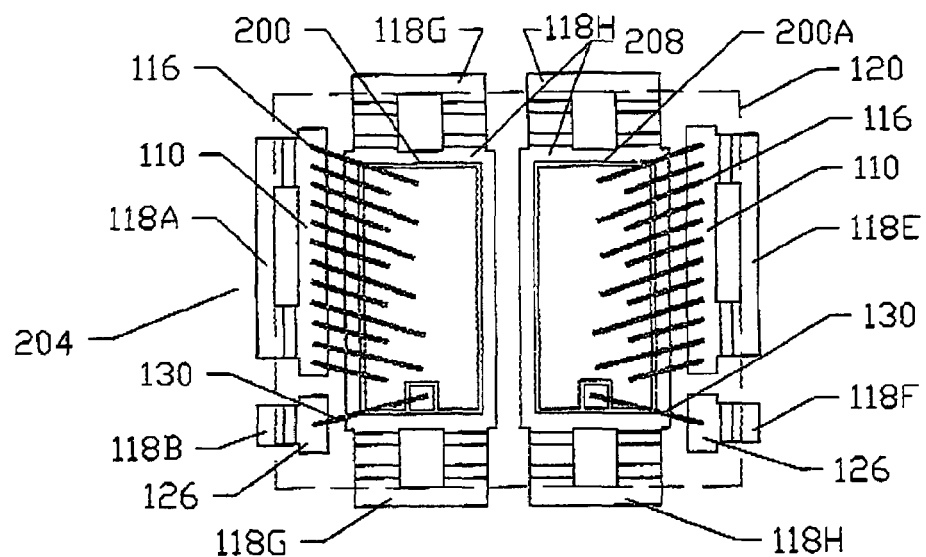
FIG. 9A is a top view of an alternative embodiment of a semiconductor package in accordance with the present invention.
Figure 9B:
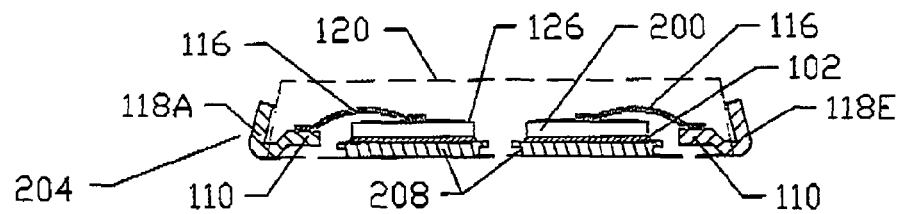
FIG. 9B is a cross sectional view of the semiconductor package of FIG. 9A in accordance with the present invention.
Figure 9C:
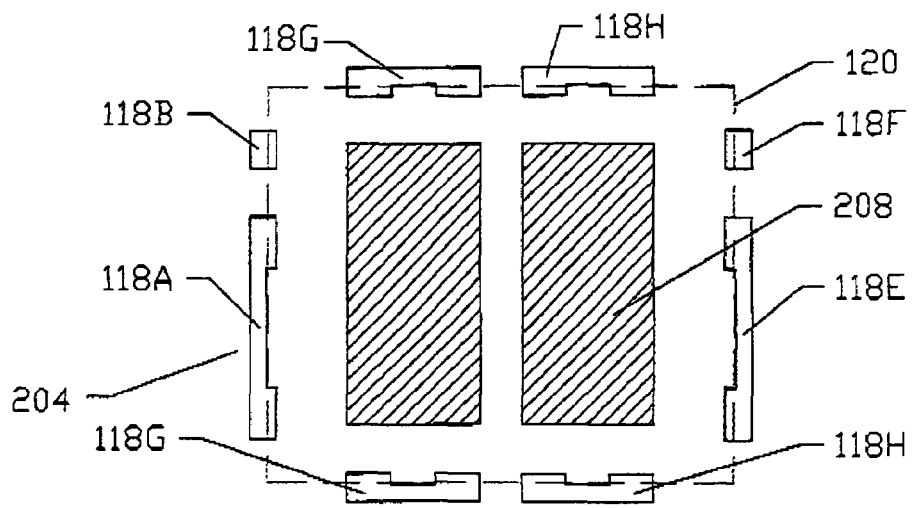
FIG. 9C is a bottom view of the semiconductor package of FIG. 9A in accordance with the present invention.

A fifth alternative embodiment of the present invention generally designated 204 is shown in FIG. 9A, FIG. 9B, and FIG. 9C. Semiconductor package 204 may be implemented as an isolated dual die device. A pair of lead frame pads 208 may be provided, each lead frame pad 208 having bonded thereto devices 200 and 200A. Device 200 may include a source lead 118A, a gate lead 118B, and drain leads 118G. Device 200A may include a source lead 118E, a gate lead 118F, and drain leads 118H.

Figure 10A:
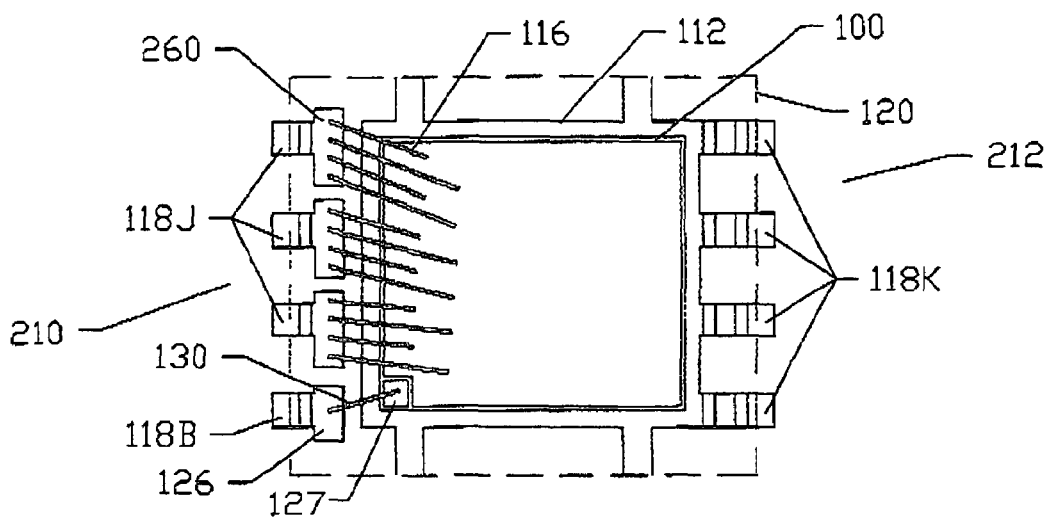
FIG. 10A is a top view of an alternative embodiment of a semiconductor package in accordance with the present invention.
Figure 10B:
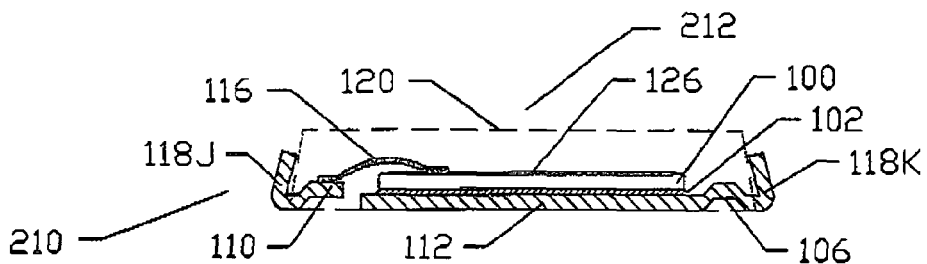
FIG. 10B is a cross sectional view of the semiconductor package of FIG. 10A in accordance with the present invention.
Figure 10C:
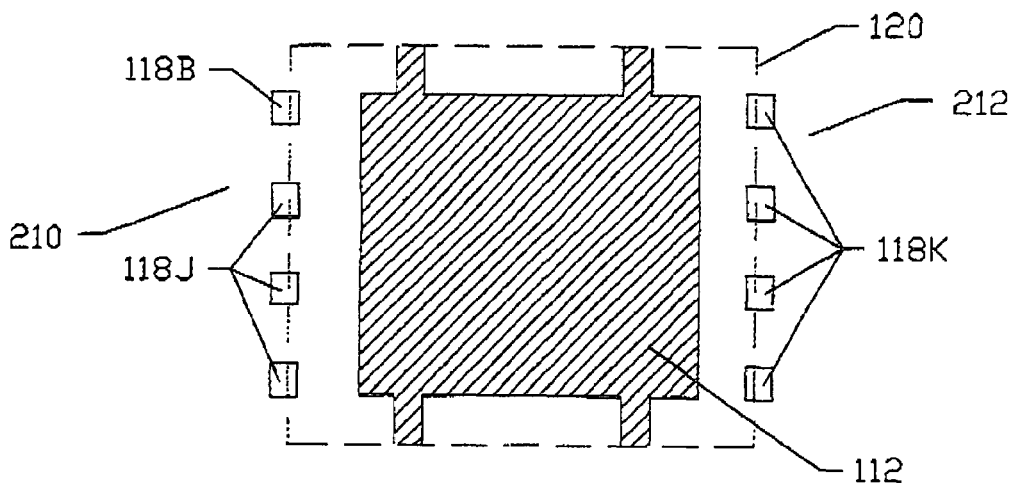
FIG. 10C is a bottom view of the semiconductor package of FIG. 10A in accordance with the present invention.

A sixth alternative embodiment of the present invention generally designated 210 is shown in FIG. 10A, FIG. 10B, and FIG. 10C. Semiconductor package 210 includes a lead frame layout that fits footprints of conventional leaded semiconductor packages while providing the advantages of the inverted "J" lead of the present invention. Semiconductor package 210 may include a lead frame generally designated 212 including a lead frame pad 112 having a die coupled thereto. A portion of lead frame 212 may be molded in resin body 120. The lead frame 212 may include a plurality of source leads 118J, a gate lead 118B, and a plurality of drain leads 118K. Source leads 118J may be disposed externally of resin body 120 and coupled to internal source bonding areas 260 which in turn may be coupled to a device source (not shown) by means of metal connectors 116. Drain leads 118K may be connected to the lead frame pad 112. Gate lead 118B may be connected to internal gate bonding area 126 which in turn may be connected to a gate pad 127 by means of metal connector 130. As shown in FIG. 10B and FIG. 10C, source leads 118J, gate lead 118B, and drain leads 118K are bent upwards in an inverted "J" configuration.

Figure 11A:
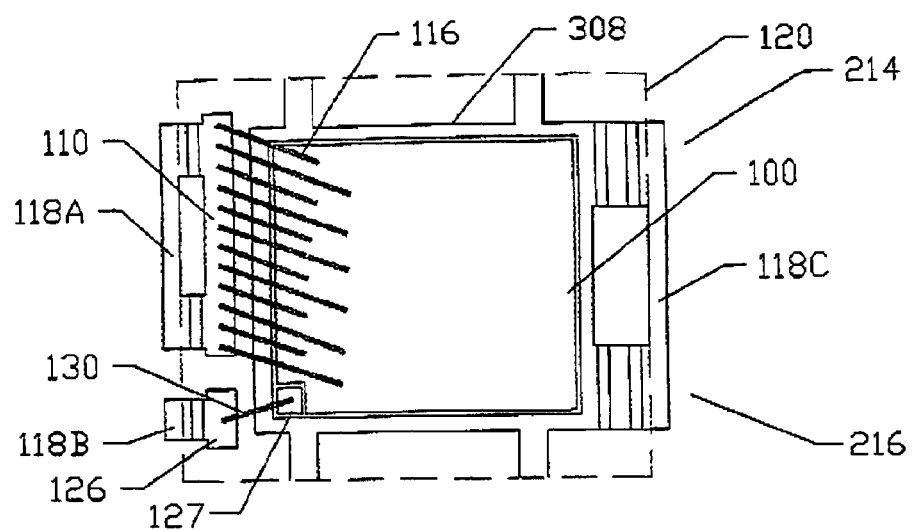
FIG. 11A is a top view of an alternative embodiment of a semiconductor package in accordance with the present invention.
Figure 11B:
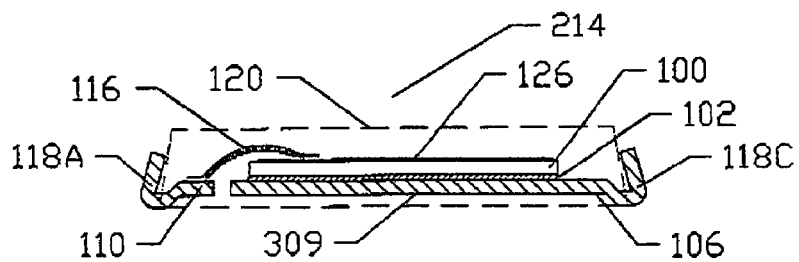
FIG. 11B is a cross sectional view of the semiconductor package of FIG. 11A in accordance with the present invention.
Figure 11C:
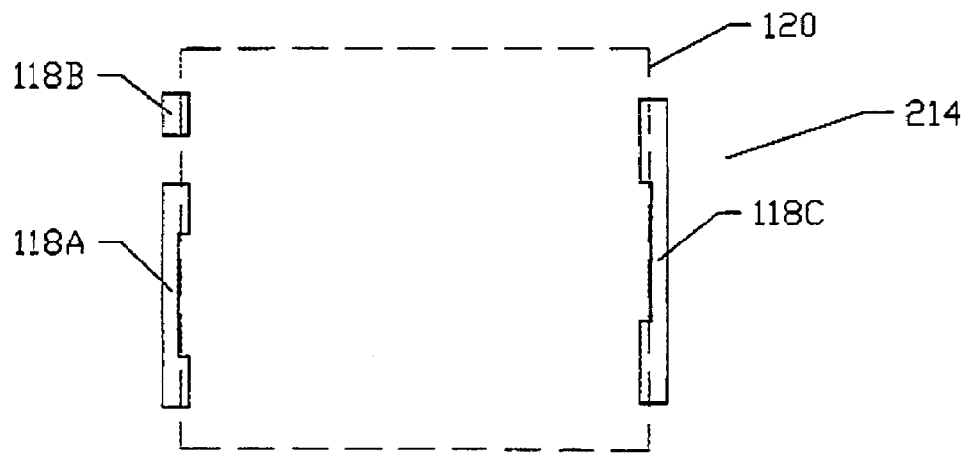
FIG. 11C is a bottom view of the semiconductor package of FIG. 10A in accordance with the present invention.

With reference to FIG. 11A, FIG. 11B, and FIG. 11C, a seventh alternative embodiment of the present invention generally designated 214 is shown. As in the embodiment shown in FIG. 5A, FIG. 5B, and FIG. 5C, the semiconductor package 214 may include a lead frame generally designated 216 having a lead frame pad 308 to which may be coupled a die 100. A portion of the lead frame 216 may be molded in a resin body 120. The lead frame 216 may include a source lead 118A, a gate lead 118B, and a drain lead 118C. Source lead 118A may be disposed externally of resin body 120 and coupled to an internal source bonding area 110 which in turn may be coupled to a device source (not shown) by means of metal connectors 116. Drain lead 118C may be connected to the lead frame pad 308. Gate lead 118B may be connected to an internal gate bonding area 126 which in turn may be connected to a gate pad 127 by means of metal connector 130. Source lead 118A, gate lead 118B, and drain lead 118C are configured in an inverted "J" configuration.

With particular reference to FIG. 11B and FIG. 11C, a bottom portion 309 of lead frame pad 308 may be encapsulated in resin body 120. Bottom portions 119A, 119B, and 119C of source lead 118A, gate lead 118B, and drain lead 118C respectively may be disposed substantially in a plane of a package bottom surface 311. Advantageously, semiconductor package 214 allows for die size reduction due to the reduced lead size of inverted "J" source lead 118A, gate lead 118B, and drain lead 118C. Additionally, semiconductor package 214 provides for easy inspection of solder joints.

Figure 12A:
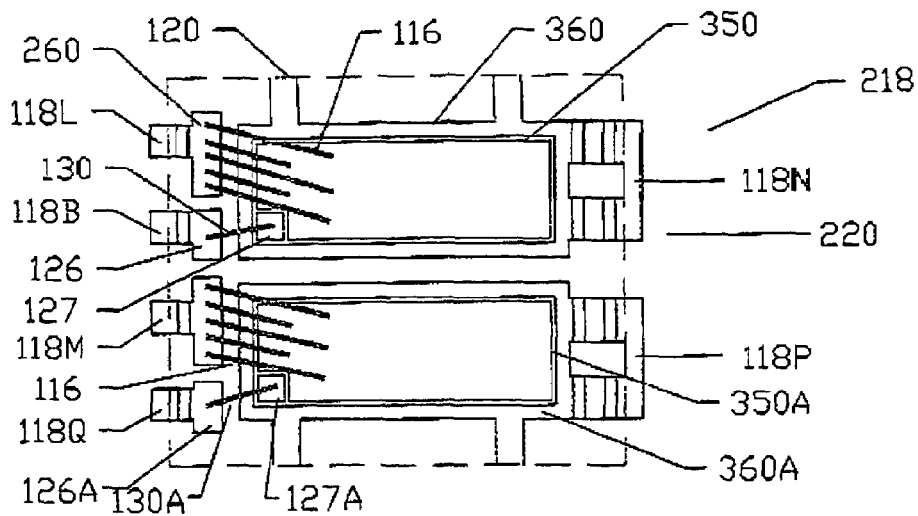
FIG. 12A is a top view of an alternative embodiment of a semiconductor package in accordance with the present invention.
Figure 12B:
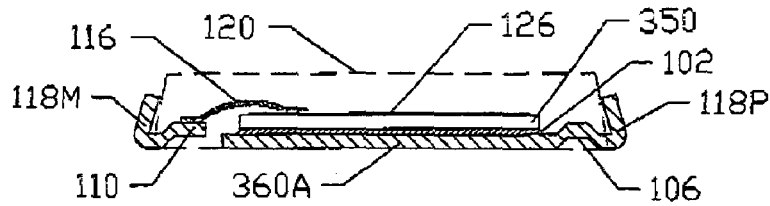
FIG. 12B is a cross sectional view of the semiconductor package of FIG. 12A in accordance with the present invention.
Figure 12C:
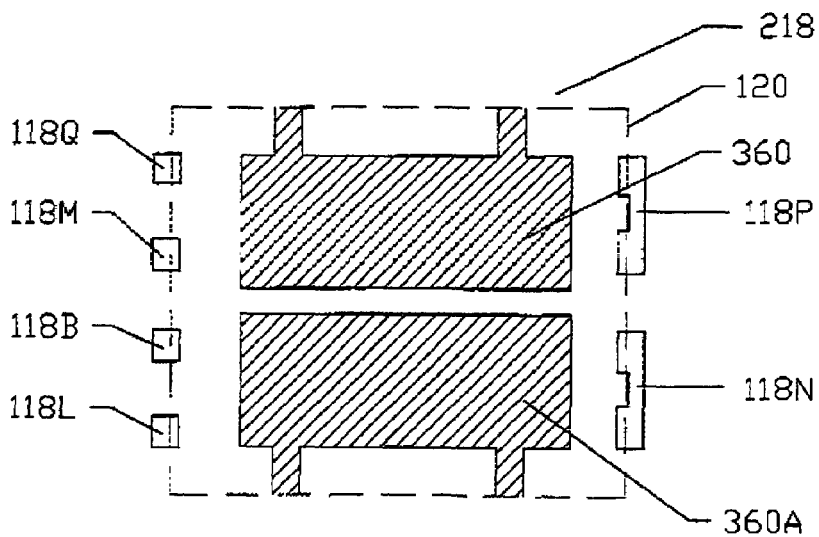
FIG. 12C is a bottom view of the semiconductor package of FIG. 12A in accordance with the present invention.

An eighth alternative embodiment of the present invention generally designated 218 is shown in FIG. 12A, FIG. 12B, and FIG. 12C. Semiconductor package 218 may include a lead frame generally designated 220 having lead frame pads 360 and 360A. A first device 350 may be bonded to lead frame pad 360 and a second device 350A may be bonded to lead frame pad 360A. A portion of the lead frame 220 may be molded in a resin body 120. The lead frame 220 may include a first source lead 118L, a first gate lead 118B, and a first drain lead 118N. First source lead 118L may be disposed externally of resin body 120 and coupled to an internal source bonding area 260 which in turn may be coupled to a device 350 source (not shown) by means of metal connectors 116. First drain lead 118N may be connected to the lead frame pad 360. First gate lead 118B may be connected to an internal gate bonding area 126 which in turn may be connected to a gate pad 127 by means of metal connector 130.

The lead frame 220 may include a second source lead 118M, a second gate lead 118Q, and a second drain lead 118P. Second source lead 118M may be disposed externally of resin body 120 and coupled to an internal source bonding area 260 which in turn may be coupled to a device 350A source (not shown) by means of metal connectors 116. Second drain lead 118P may be connected to the lead frame pad 360A. Second gate lead 118Q may be connected to an internal gate bonding area 126A which in turn may be connected to a gate pad 127A by means of metal connector 130A.

First and second source leads 118L and 118M, first and second gate leads 118B and 118Q, and first and second drain leads 118N and 118P may be bent upwards in an inverted "J" configuration as shown in FIG. 12B and FIG. 12C. Advantageously solder will wick up first and second source leads 118L and 118M, first and second gate leads 118B and 118Q, and first and second drain leads 118N and 118P to thereby provide for easy inspection of the solder joints and to increase the contact area for first and second source leads 118L and 118M, first and second gate leads 118B and 118Q, and first and second drain leads 118N and 118P.

Figure 13A:
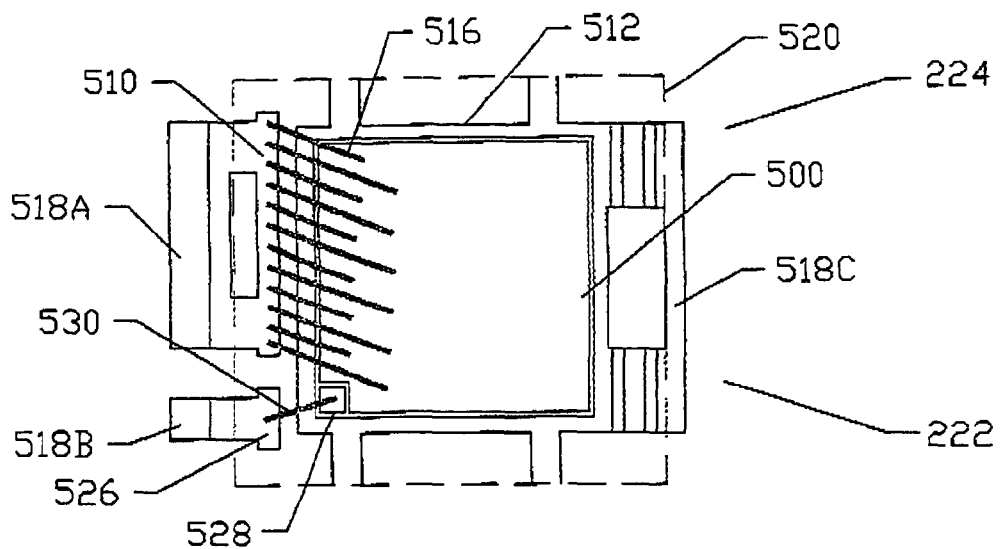
FIG. 13A is a top view of an alternative embodiment of a semiconductor package in accordance with the present invention.
Figure 13B:
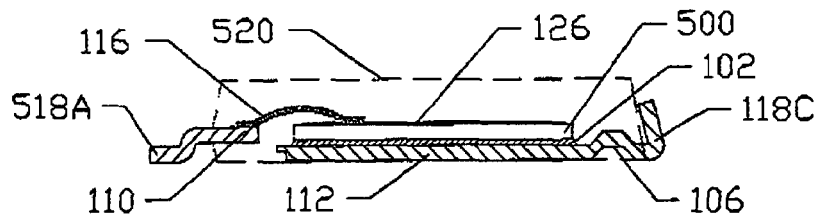
FIG. 13B is a cross sectional view of the semiconductor package of FIG. 13A in accordance with the present invention.
Figure 13C:
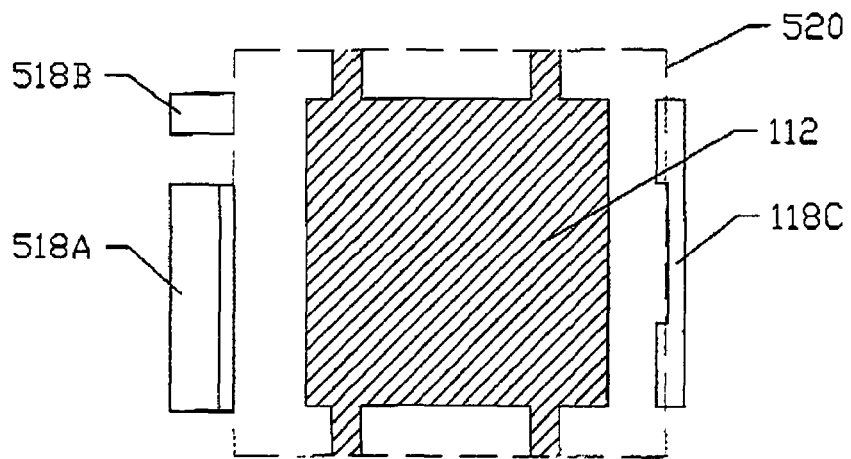
FIG. 13C is a bottom view of the semiconductor package of FIG. 13A in accordance with the present invention.

With reference to FIG. 13A, FIG. 13B, and FIG. 13C, a ninth alternative embodiment of the present invention generally designated 222 is shown. Semiconductor package generally 222 includes a lead frame generally designated 224 having a lead frame pad 512 to which may be coupled a die 500. A portion of the lead frame 224 may be molded in a resin body 520. The lead frame 224 includes a source terminal 518A, a gate terminal 518B, and a drain terminal 518C. Source terminal 518A of the lead frame 224 may be coupled to an internal source bonding area 510 where metal connectors 516 are bonded. Drain terminal 518C may be connected to lead frame pad 512. Gate terminal 518B may be connected to an internal gate bonding area 526 which in turn may be connected to a gate pad 528 by means of metal connector 530.

With particular reference to FIG. 13B and FIG. 13C, semiconductor package 222 may include source terminal 518A and gate terminal 518B having a conventional "J" lead configuration. Drain terminal 518C may include an inverted "J" configuration.

Figure 14A:
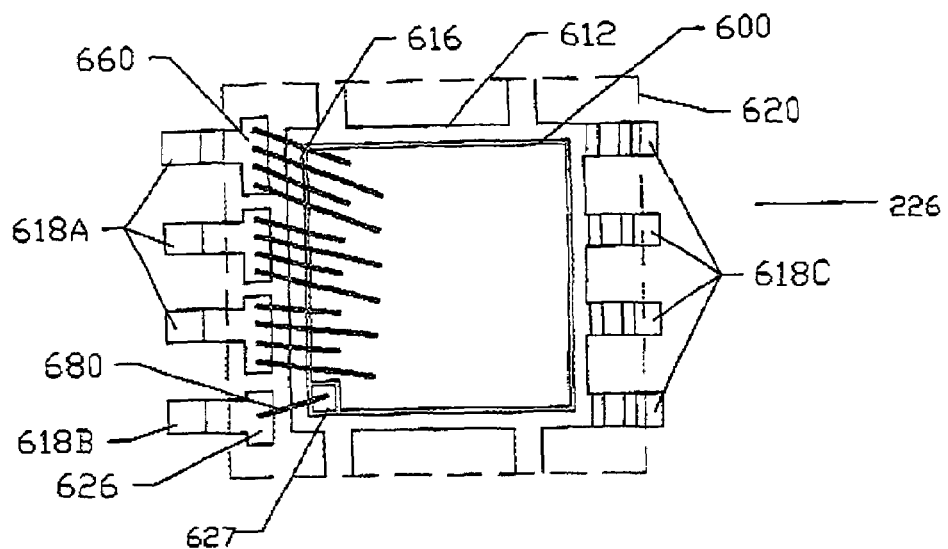
FIG. 14A is a top view of an alternative embodiment of a semiconductor package in accordance with the present invention.

A tenth alternative embodiment of the present invention is shown in FIG. 14A including a semiconductor package generally designated 226. Semiconductor package 226 may include a lead frame generally designated 228 having a lead frame pad 612 to which may be bonded a die 600. A portion of lead frame 228 may be encapsulated in a resin body 620. A plurality of source leads 618A may be coupled to internal source bonding pads 660 which may be in turn coupled to a device source (not shown) by means of metal connectors 616. A gate lead 618B may be coupled to an internal gate bonding pad 626 coupled to a gate pad 627 by means of metal connector 630. A plurality of drain leads 618C may be coupled to lead frame pad 612. As shown, source leads 618A and gate lead 618B are configured in a conventional "J" lead configuration. Drain leads 618C are configured in an inverted "J" lead configuration.

Figure 14B:
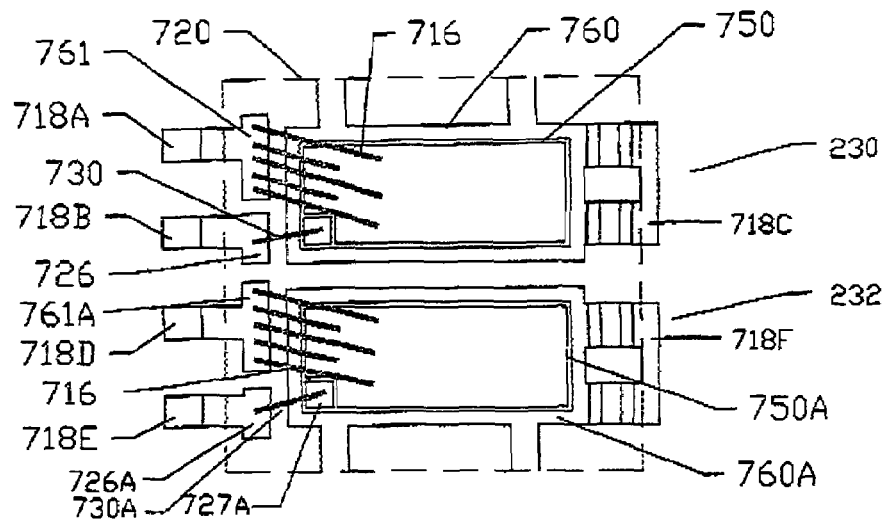
FIG. 14B is a top view of an alternative embodiment of a semiconductor package in accordance with the present invention.

With reference to FIG. 14B, an eleventh alternative embodiment of the present invention generally designated 230 is shown. Semiconductor package 230 may include a lead frame generally designated 232 having lead frame pads 760 and 760A. A first device 750 may be bonded to lead frame pad 760 and a second device 750A may be bonded to lead frame pad 760A. A portion of the lead frame 232 may be molded in a resin body 720. The lead frame 232 may include a first source lead 718A, a first gate lead 718B, and a first drain lead 718C. First source lead 718A may be disposed externally of resin body 720 and coupled to an internal source bonding area 761 which in turn may be coupled to a device 750 source (not shown) by means of metal connectors 716. First drain lead 718C may be connected to the lead frame pad 760. First gate lead 718B may be connected to an internal gate bonding area 726 which in turn may be connected to a gate pad 727 by means of metal connector 730.

The lead frame 232 may include a second source lead 718D, a second gate lead 718E, and a second drain lead 718F. Second source lead 718D may be disposed externally of resin body 720 and coupled to an internal source bonding area 761A which in turn may be coupled to a device 750A source (not shown) by means of metal connectors 716. Second drain lead 718F may be connected to the lead frame pad 760A.

Second gate lead 718E may be connected to an internal gate bonding area 726A which in turn may be connected to a gate pad 727A by means of metal connector 730A.

Figure 14C:
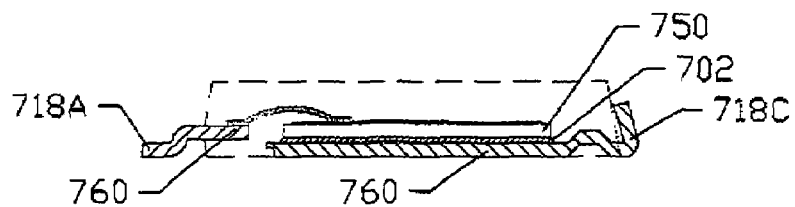
FIG. 14C is a cross sectional view of the semiconductor package of FIG. 14B in accordance with the present invention.

With reference to FIG. 14C, source leads 718A and 718D and gate leads 718B and 718E are shown configured in a conventional "J" lead configuration. Drain leads 718C and 718F are shown configured in an inverted "J" lead configuration.

Figure 15A:
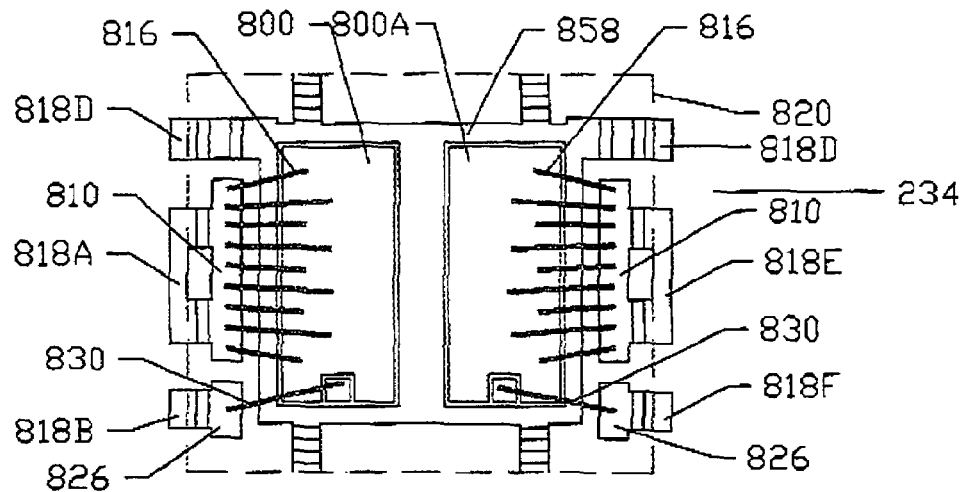
FIG. 15A is a top view of an alternative embodiment of a semiconductor package in accordance with the present invention.
Figure 15B:
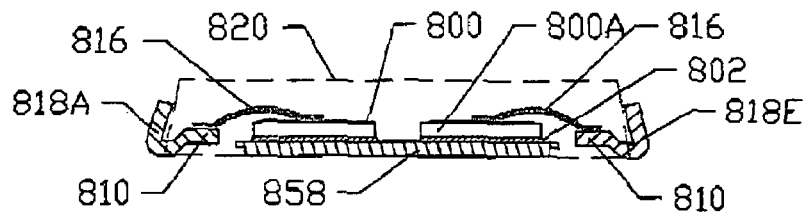
FIG. 15B is a cross sectional view of the semiconductor package of FIG. 15A in accordance with the present invention.
Figure 15C:
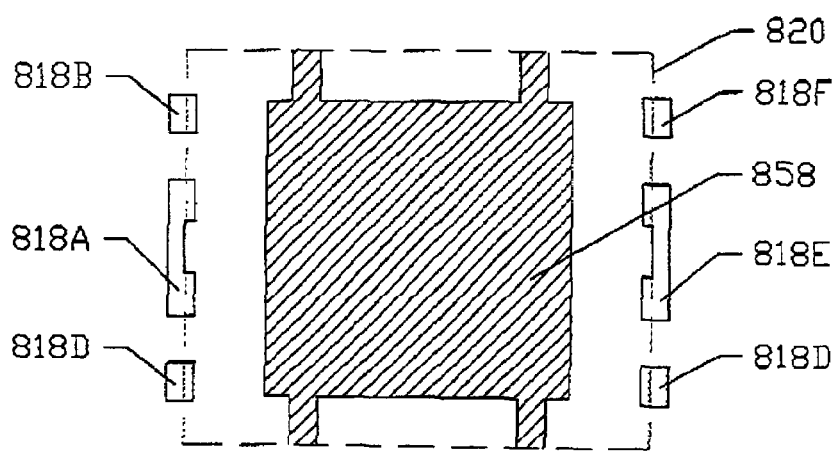
FIG. 15C is a bottom view of the semiconductor package of FIG. 15A in accordance with the present invention.

With reference to FIG. 15A, FIG. 15B, and FIG. 15C, a twelfth alternative embodiment of the present invention generally designated 234 is shown. Semiconductor package 234 may be implemented as a common drain dual die device. A pair of devices 800 and 800A may be bonded to lead frame pad 858. Device 800 may include a source lead 818A, a gate lead 818B, and shared drain leads 818D. Device 800A may include a source lead 818E, a gate lead 818F, and the shared drain leads 818D. In contrast to the fourth alternative embodiment shown in FIG. 8A, FIG. 8B, and FIG. 8C, the shared drain leads 818D of the twelfth alternative embodiment are disposed along a same edge of the semiconductor package 234 as the source leads 818A and 818E and gate leads 818B and 818F.

Figure 16:
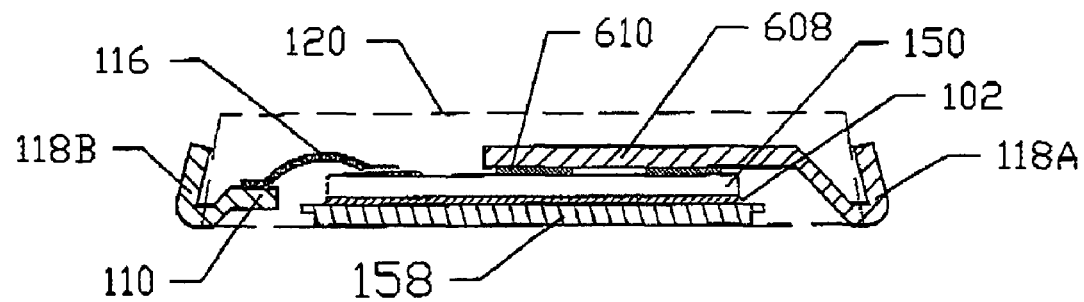
FIG. 16 is a cross sectional view of an alternative embodiment of a semiconductor package in accordance with the present invention.

A thirteenth embodiment of the present invention generally designated 900 is shown in FIG. 16. Semiconductor package 900 may include a lead frame pad 958 having mounted thereon a semiconductor device 950. A resin body 920 may encapsulate a portion of a lead frame (not shown). A plurality of solder regions 911 may be used to connect a lead portion 908 of lead frame to a device region. The device region may be a source region in the case of a vertical device and a drain region in the case of a lateral device. A lead 918A may be coupled to lead portion 908. A gate lead 918B may be coupled to a gate lead pad 910 which may be in turn coupled to a device gate region by means of a metal connector 916. Gate lead 918B and lead 918A are configured in an inverted "J" lead configuration.

Figure 17:
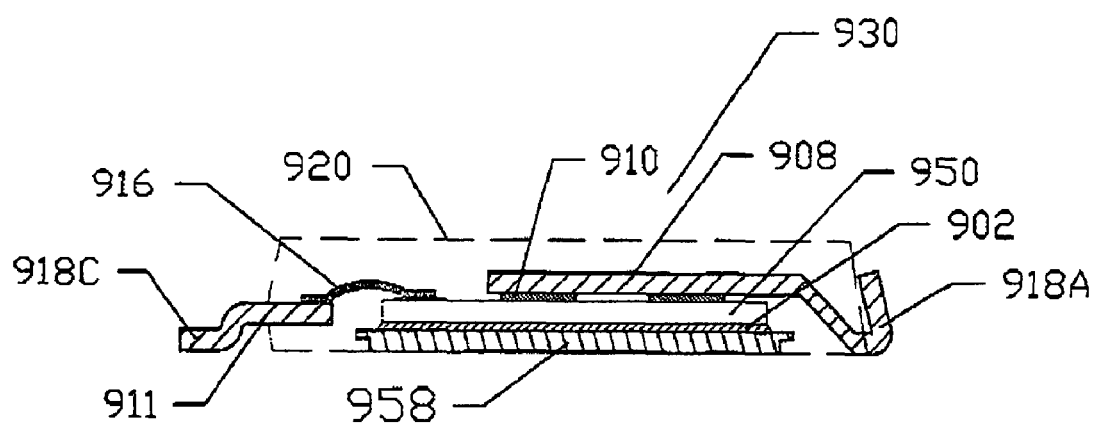
FIG. 17 is a cross sectional view of an alternative embodiment of a semiconductor package in accordance with the present invention.

With reference to FIG. 17, a fourteenth alternative embodiment of the present invention generally designated 930 is shown. Semiconductor package 930 may include lead frame pad 958 having mounted thereon semiconductor device 950. Resin body 920 may encapsulate a portion of a lead frame (not shown). Solder regions 910 may be used to connect lead portion 908 of lead frame to a device region. The device region may be a source region in the case of a vertical device and a drain region in the case of a lateral device. Lead 918A may be coupled to lead portion 908. Gate lead 918C may be coupled to gate lead pad 910 which may be in turn coupled to a device gate region by means of metal connector 916. Lead 918A may be configured in an inverted "J" lead configuration. Gate lead 918C may be configured in a conventional "J" lead configuration.

Figure 18:
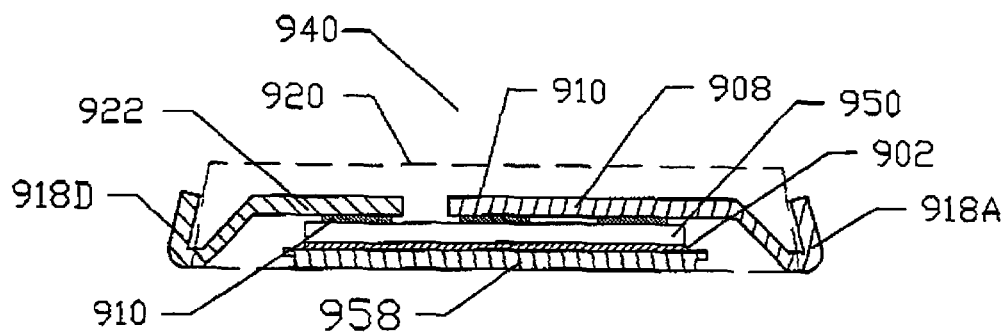
FIG. 18 is a cross sectional view of an alternative embodiment of a semiconductor package in accordance with the present invention.

A fifteenth alternative embodiment of the present invention generally designated 940 is shown in FIG. 18. Semiconductor package 940 may include lead frame pad 958 having mounted thereon semiconductor device 950. Resin body 920 may encapsulate a portion of a lead frame (not shown). Solder regions 910 may be used to connect lead portion 908 of lead frame to a device region and lead portion 922 to another device region. The device regions may be a source region in the case of a vertical device and a drain region in the case of a lateral device. Lead 918A may be coupled to lead portion 908 and lead 918D may be coupled to lead portion 922. Leads 918A and 918D may be configured in an inverted "J" lead configuration.

Figure 19:
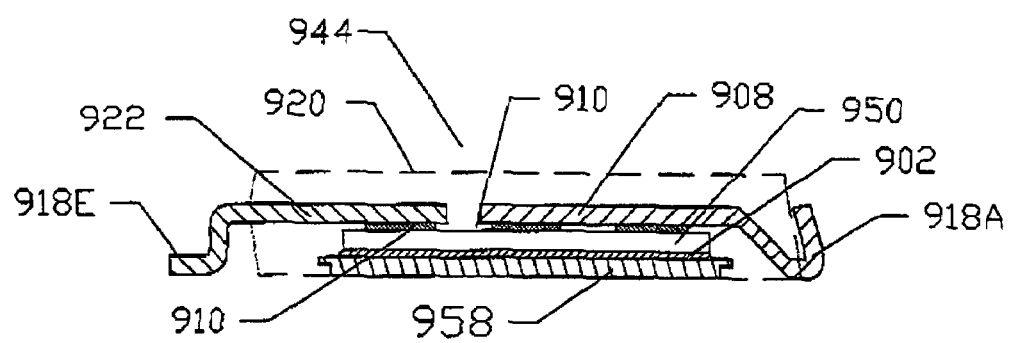
FIG. 19 is a cross sectional view of an alternative embodiment of a semiconductor package in accordance with the present invention.

With reference to FIG. 19, a sixteenth alternative embodiment of the present invention generally designated 944 is shown. Semiconductor package 944 may include lead frame pad 958 having mounted thereon semiconductor device 950. Resin body 920 may encapsulate a portion of a lead frame (not shown). Solder regions 910 may be used to connect lead portion 908 of lead frame to a device region and lead portion 922 to another device region. The device regions may be a source region in the case of a vertical device and a drain region in the case of a lateral device. Lead 918A may be coupled to lead portion 908 and lead 918E may be coupled to lead portion 922. Lead 918A may be configured in an inverted "J" lead configuration. Lead 918E may be configured in a conventional "J" lead configuration.

Figure 20:
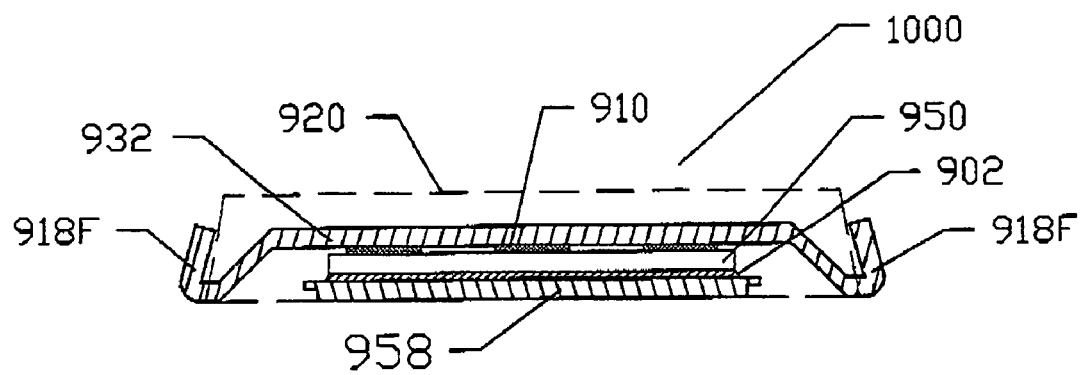
FIG. 20 is a cross sectional view of an alternative embodiment of a semiconductor package in accordance with the present invention.

A seventeenth alternative embodiment of the present invention generally designated 1000 is shown in FIG. 20. Semiconductor package 1000 may include lead frame pad 958 having mounted thereon semiconductor device 950. Resin body 920 may encapsulate a portion of a lead frame (not shown). Solder regions 910 may be used to connect lead portion 932 of lead frame to a device region. The device regions may be a source region in the case of a vertical device and a drain region in the case of a lateral device. Leads 918F may be coupled to lead portion 932. Leads 918F may be configured in an inverted "J" lead configuration.

Figure 21:
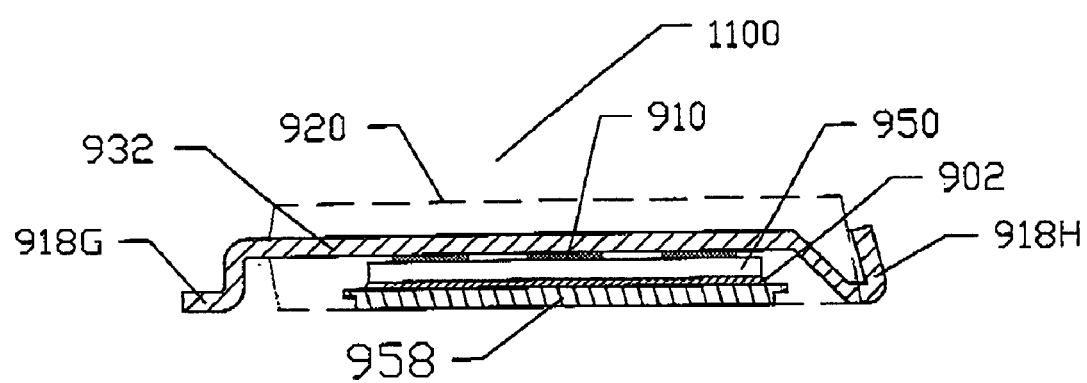
FIG. 21 is a cross sectional view of an alternative embodiment of a semiconductor package in accordance with the present invention.

With reference to FIG. 21, an eighteenth alternative embodiment of the present invention generally designated 1100 is shown. Semiconductor package 1100 may include lead frame pad 958 having mounted thereon semiconductor device 950. Resin body 920 may encapsulate a portion of a lead frame (not shown). Solder regions 910 may be used to connect lead portion 932 of lead frame to a device region. The device regions may be a source region in the case of a vertical device and a drain region in the case of a lateral device. Leads 918G and 918H may be coupled to lead portion 932. Lead 918H may be configured in an inverted "J" lead configuration. Lead 918G may be configured in a conventional "J" lead configuration.

Figure 22:
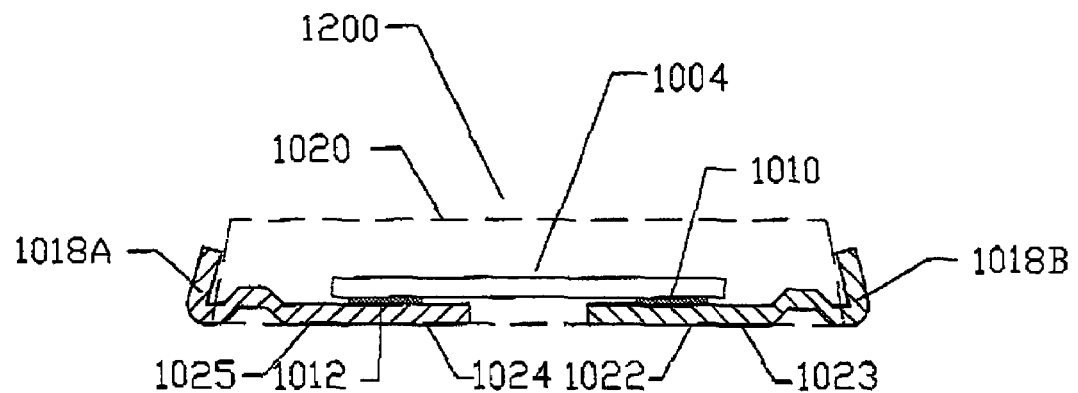
FIG. 22 is a cross sectional view of an alternative embodiment of a semiconductor package in accordance with the present invention.

A nineteenth alternative embodiment of the present invention generally designated 1200 is shown in FIG. 22. Semiconductor package 1200 may include an IC 1004 having all of its terminals (not shown) disposed on a same silicon surface. A first solder region 1012 may couple a first IC terminal to a lead frame portion 1024 which may in turn be coupled to a lead 1018A. A second solder region 1010 may coupled a second IC terminal to a lead frame portion 1022 which may in turn be coupled to a lead 1018B. Bottom surfaces 1025 and 1023 of lead frame portions 1024 and 1022 respectively may be exposed through a resin body 1020. Leads 1018A and 1018B may be configured in an inverted "J" configuration.

Figure 23:
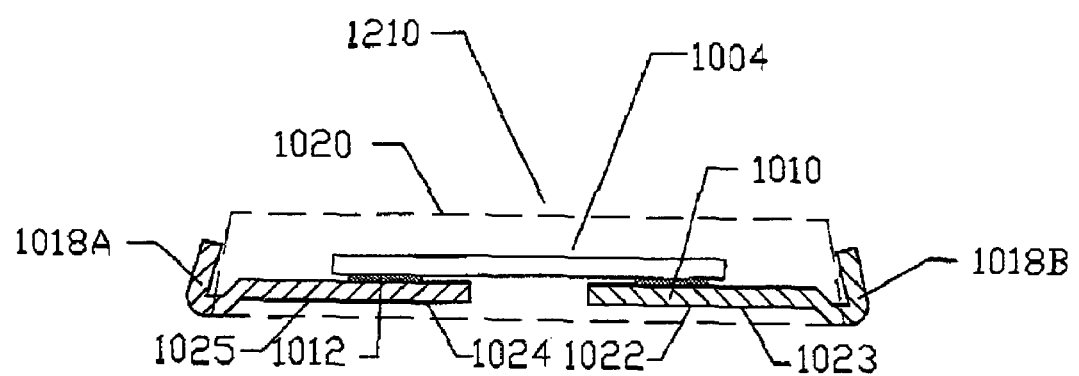
FIG. 23 is a cross sectional view of an alternative embodiment of a semiconductor package in accordance with the present invention.

With reference to FIG. 23, a twentieth alternative configuration of the present invention generally designated 1210 is shown. Semiconductor package 1210 may include IC 1004 having all of its terminals (not shown) disposed on the same silicon surface. First solder region 1012 may couple a first IC terminal to lead frame portion 1024 which may in turn be coupled to lead 1018A. Second solder region 1010 may coupled a second IC terminal to lead frame portion 1022 which may in turn be coupled to lead 1018B. Bottom surfaces 1025 and 1023 of lead frame portions 1024 and 1022 respectively may be encapsulated in resin body 1020. Leads 1018A and 1018B may be configured in an inverted "J" configuration.

Figure 24:
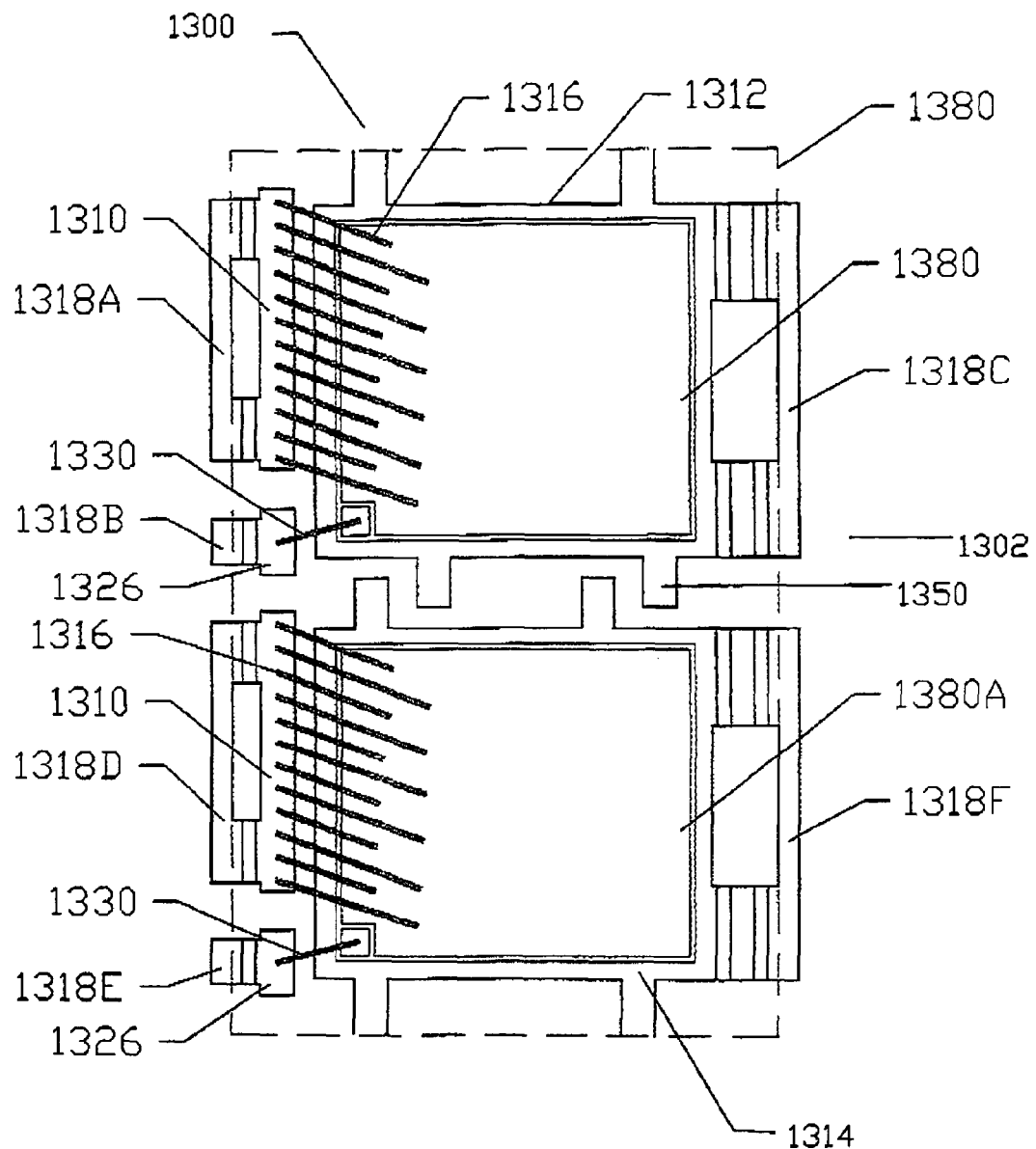
FIG. 24 is a top view of an alternative embodiment of a semiconductor package in accordance with the present invention.

A twenty first alternative embodiment of the present invention generally designated 1300 is shown in FIG. 24. Semiconductor package 1300 may include a lead frame generally designated 1302 having a first lead frame pad 1312 and a second lead frame pad 1314. A first semiconductor device 1380 may be mounted on first lead frame pad 1312 and a second semiconductor device 1380A may be mounted on second lead frame pad 1314. First device 1380 may be coupled to a first source lead 1318A, a first gate lead 1318B, and a first drain gate lead 1318C. Second device 1380A may be coupled to a second source lead 1318D, a second gate lead 1318E, and a second drain lead 1318F. First drain lead 1318C is shown disposed opposite first source lead 1318A and first gate lead 1318B. Second drain lead 1318F is shown disposed opposite second source lead 1318D and second gate lead 1318E. First and second drain leads 1318C and 1318F may be disposed on a same side of semiconductor package 1300. All leads 1318A, 1318B, 1318C, 1318D, 1318E, and 1318F may be configured in an inverted "J" lead configuration.

With continued reference to FIG. 24, first and second lead frame pads 1312 and 1314 may include a plurality of interlocking structures 1350. Interlocking structures 1350 may be used to keep devices 1380 and 1380A, which may be large devices, in place during bonding of metal connectors 1316.

Figure 25:
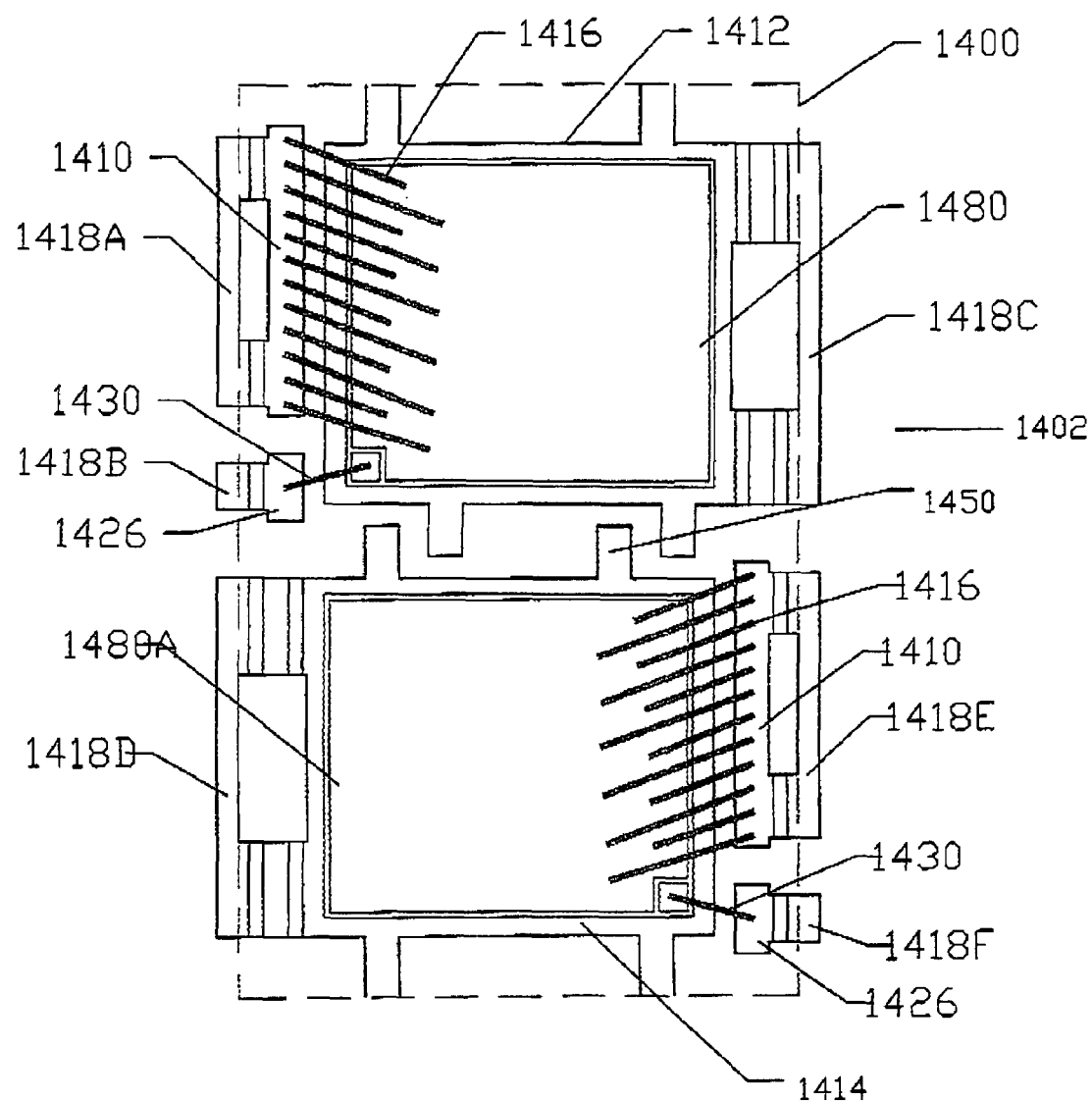
FIG. 25 is a top view of an alternative embodiment of a semiconductor package in accordance with the present invention.

A twenty second alternative embodiment of the present invention generally designated 1400 is shown in FIG. 25. Semiconductor package 1400 may include a lead frame generally designated 1402 having a first lead frame pad 1412 and a second lead frame pad 1414. A first semiconductor device 1480 may be mounted on first lead frame pad 1412 and a second semiconductor device 1480A may be mounted on second lead frame pad 1414. First device 1480 may be coupled to a first source lead 1418A, a first gate lead 1418B, and a first drain gate lead 1418C. Second device 1480A may be coupled to a second source lead 1418E, a second gate lead 1418F, and a second drain lead 1418D. First drain lead 1418C is shown disposed opposite first source lead 1418A and first gate lead 1418B. Second drain lead 1418F is shown disposed opposite second source lead 1418D and second gate lead 1418E. First and second drain leads 1418C and 1418F are disposed on an opposite side of semiconductor package 1400. All leads 1418A, 1418B, 1418C, 1418D, 1418E, and 1418F may be configured in an inverted "J" lead configuration.

With continued reference to FIG. 25, first and second lead frame pads 1412 and 1414 may include a plurality of interlocking structures 1450. Interlocking structures 1450 may be used to keep devices 1480 and 1480A, which may be large devices, in place during bonding of metal connectors 1416.

It should be understood, of course, that the foregoing relates to preferred embodiments of the invention and that modifications may be made without departing from the spirit and scope of the invention as set forth in the following claims.

We claim:

1. A semiconductor package comprising:
    a lead frame having a plurality of leads and a lead frame pad, the lead frame pad including a die coupled thereto, at least one of the plurality of leads having an upwardly extending external portion forming an acute angle relative to a bottom surface of the package;
    metal connectors connecting the die to the plurality of leads; and
    a resin body encapsulating the die, metal connectors and a portion of the lead frame excluding the external portion of the at least one of the plurality of leads, the upwardly extending portion of the at least one of the plurality of leads extending along and terminating at a side portion of the resin body adjacent the bottom surface of the package.

2. The semiconductor package according to claim 1, wherein the lead frame pad is exposed through a bottom surface of the package.

3. The semiconductor package according to claim 1, wherein the die comprises an integrated circuit.

4. The semiconductor package according to claim 3, wherein at least one of the plurality of leads is coupled to an integrated circuit terminal by a wireless solder connection.

5. The semiconductor package according to claim 3, wherein the integrated circuit comprises a FET device.

6. The semiconductor package according to claim 5, wherein the plurality of leads comprise a source lead, a gate lead, and a drain lead coupled respectively to the FET device source region, gate region, and drain region.

7. The semiconductor package according to claim 6, wherein the source lead comprises a fused solid piece.

8. The semiconductor package according to claim 6, wherein the source lead and gate lead are disposed adjacent each other on an opposite side of the semiconductor package from the drain lead.

9. The semiconductor package according to claim 6, wherein the source lead is coupled to a source bonding area disposed internally of the resin body and the gate lead is coupled to a gate bonding area disposed internally of the resin body, the source bonding area and gate bonding area being disposed in a plane slightly lower than a top surface of the FET device, and the metal connectors being relatively short and connecting the source lead to the source bonding area and the gate lead to the gate bonding area.

10. The semiconductor package according to claim 6, wherein the source lead, gate lead, and drain lead each comprise an external portion sloped upwards relative to a bottom surface of the package.

11. The semiconductor package according to claim 6, wherein the drain lead comprises an external portion sloped upwards relative to the bottom surface of the package.

12. The semiconductor package according to claim 6, wherein the drain lead comprises a notch.

13. The semiconductor package according to claim 6, further comprising a second source lead coupled to the FET device source region and a second drain lead coupled to the FET device drain region.

14. The semiconductor package according to claim 13, wherein the drain leads are disposed opposite each other and the source leads are disposed opposite each other.

15. The semiconductor package according to claim 13, wherein the source leads are stitch bonded to the FET device source region.

16. The semiconductor package according to claim 1, further comprising a second die coupled to the lead frame pad.

17. The semiconductor package according to claim 16, wherein the die comprise FET devices and each FET device shares a drain lead.

18. The semiconductor package according to claim 17, wherein the drain lead comprises a pair of drain leads disposed opposite each other.

19. The semiconductor package according to claim 16, wherein the lead frame pad is exposed through the bottom surface of the package.

20. A semiconductor package comprising:
    a lead frame having first and second pluralities of leads and a pair of lead frame pads, each lead frame pad including a die coupled thereto, at least one of the first and second pluralities of leads having an upwardly extending external portion sloped upwards relative to a bottom surface of the package and forming an acute angle relative thereto;
    metal connectors connecting each die to respective first and second pluralities of leads; and
    a resin body encapsulating the die, metal connectors and a portion of the lead frame excluding the external portion of the at least one of the first and second pluralities of leads, the upwardly extending portion of the at least one of the first and second pluralities of leads extending along and terminating at a side portion of the resin body adjacent the bottom surface of the package.

21. The semiconductor package according to claim 20, wherein each lead frame pad further comprises a plurality of interlocking structures.

22. The semiconductor package according to claim 20, wherein the die are FET devices and each FET device shares a drain lead.

23. The semiconductor package according to claim 22, wherein the drain lead comprises two leads disposed opposite one another.

24. The semiconductor package according to claim 22, wherein the drain lead comprises two leads disposed adjacent one another.

25. The semiconductor package according to claim 20, wherein the lead frame pads are exposed through the bottom surface of the package.

26. A semiconductor package housing an electronic device comprising:

a lead frame having a plurality of leads and a lead frame pad, the lead frame pad including the electronic device coupled thereto, the plurality of leads having an external portion sloped upwards and at an acute angle relative to a bottom surface of the package;

metal connectors connecting the electronic device to the plurality of leads; and a resin body encapsulating the electronic device, metal connectors and a portion of the lead frame excluding the external portions of the plurality of leads, the external portions of the plurality of leads extending along and terminating at a side portion of the resin body adjacent the bottom surface of the package.

* * * * *